United States Patent
Ortiz

(10) Patent No.: US 9,118,280 B2
(45) Date of Patent: Aug. 25, 2015

(54) HIGH VOLTAGE WIDE BANDWIDTH AMPLIFIER

(71) Applicant: Raytheon Company, Waltham, MA (US)

(72) Inventor: Joe A. Ortiz, Garden Grove, CA (US)

(73) Assignee: RAYTHEON COMPANY, Waltham, MA (US)

(*) Notice: Subject to any disclaimer, the term of this patent is extended or adjusted under 35 U.S.C. 154(b) by 54 days.

(21) Appl. No.: 14/041,157

(22) Filed: Sep. 30, 2013

(65) Prior Publication Data

US 2015/0091654 A1    Apr. 2, 2015

(51) Int. Cl.
| | |
|---|---|
| *H03F 3/185* | (2006.01) |
| *H03F 3/21* | (2006.01) |
| *H03F 1/48* | (2006.01) |
| *H03F 3/08* | (2006.01) |
| *H03F 3/19* | (2006.01) |
| *H03F 3/30* | (2006.01) |

(52) U.S. Cl.
CPC ............. *H03F 3/185* (2013.01); *H03F 1/483* (2013.01); *H03F 3/085* (2013.01); *H03F 3/19* (2013.01); *H03F 3/211* (2013.01); *H03F 3/3037* (2013.01); *H03F 2200/03* (2013.01); *H03F 2200/18* (2013.01); *H03F 2200/276* (2013.01); *H03F 2203/21131* (2013.01); *H03F 2203/30021* (2013.01); *H03F 2203/30033* (2013.01); *H03F 2203/30066* (2013.01)

(58) Field of Classification Search
CPC ..................... H03F 3/2171; H03F 2200/276
USPC ................................................ 330/59, 251
See application file for complete search history.

(56) References Cited

U.S. PATENT DOCUMENTS

| | | | |
|---|---|---|---|
| 2,750,450 A | 6/1956 | Achenbach et al. | |
| 3,546,611 A | 12/1970 | Dague | |
| 5,216,379 A | 6/1993 | Hamley | |
| 6,861,909 B1 | 3/2005 | Kobayashi | |
| 2004/0081409 A1* | 4/2004 | Ho | 385/92 |
| 2004/0169552 A1 | 9/2004 | Butler | |

FOREIGN PATENT DOCUMENTS

DE        4131782 A1     3/1993

OTHER PUBLICATIONS

International Search Report and Written Opinion for PCT Application No. PCT/US2014/047743, dated Nov. 7, 2014, pp. 1-14.
Meyer et al., "Optical Control of 1200-V and 20-A SiC MOSFET", Applied Power Electronics Conference and Exposition (APEC), Feb. 5, 2012, pp. 2530-2533.

* cited by examiner

*Primary Examiner* — Steven J Mottola
(74) *Attorney, Agent, or Firm* — Cantor Colburn LLP

(57) ABSTRACT

A high voltage amplifier and a method of assembling and of operating a high voltage amplifier are described. The device includes a first metal-oxide-semiconductor field-effect transistor (MOSFET) driven by a first gate drive circuit. The device also includes a second MOSFET driven by a second gate drive circuit and a first optocoupler coupled to the second gate drive circuit. The first MOSFET and the second MOSFET of the high voltage amplifier drive a first output voltage.

20 Claims, 4 Drawing Sheets

US 9,118,280 B2

HIGH VOLTAGE WIDE BANDWIDTH AMPLIFIER

FEDERALLY SPONSORED RESEARCH AND DEVELOPMENT

This invention was made with Government support under Contract No.: FA8650-12-C-7269, awarded by the Department of Defense. The Government has certain rights in this invention.

BACKGROUND

The present disclosure relates generally to electronic amplifiers and, more particularly, to a high voltage, wide bandwidth amplifier.

Currently, available amplifiers are typically limited in output voltage amplitude range, bandwidth, or both. Many of these amplifiers use tubes or several transistors in series but are still limited in output voltage, bandwidth, or both. For example, the output may be limited to the order of 4 kilo Volts (kV) or 1 kV peak with a bandwidth of 200 kilo Hertz (kHz). In addition, for high voltage output requirements, conventional audio amplifier complementary symmetry and quasi-complementary symmetry may not be possible.

SUMMARY

According to one embodiment, a device includes a first metal-oxide-semiconductor field-effect transistor (MOSFET) driven by a first gate drive circuit; a second MOSFET driven by a second gate drive circuit; and a first optocoupler coupled to the second gate drive circuit, wherein the first MOSFET and the second MOSFET drive a first output voltage.

According to another embodiment, a method of assembling a device includes arranging a first metal-oxide-semiconductor field-effect transistor (MOSFET) to be driven by a first gate drive circuit; arranging a second MOSFET to be driven by a second gate drive circuit; and arranging a first optocoupler to be coupled to the second gate drive circuit, wherein the first MOSFET and the second MOSFET drive a first output voltage.

According to yet another embodiment, a method of operating an amplifier device includes driving a first metal-oxide-semiconductor field-effect transistor (MOSFET) with a first gate drive circuit; driving a second MOSFET with a second gate drive circuit; coupling a first optocoupler coupled to the second gate drive circuit; and driving, with the first MOSFET and the second MOSFET, a first output voltage.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As noted above, currently available amplifiers are limited in output voltage, bandwidth, or both. However, certain applications require both high voltage output (on the order of 5 kilovolts (kV), for example) and wide bandwidth (from DC up to 10 megahertz (MHz), for example). One such application is in Fringe Image Telescopy, for example. Embodiments of the device and method of amplifying described herein relate to using a pair of metal-oxide-semiconductor field-effect transistors (MOSFETs) in a push-pull configuration (also known as a totem-pole configuration, or half bridge configuration) to achieve a high voltage output with a bandwidth from DC to several megahertz.

Figure 1:
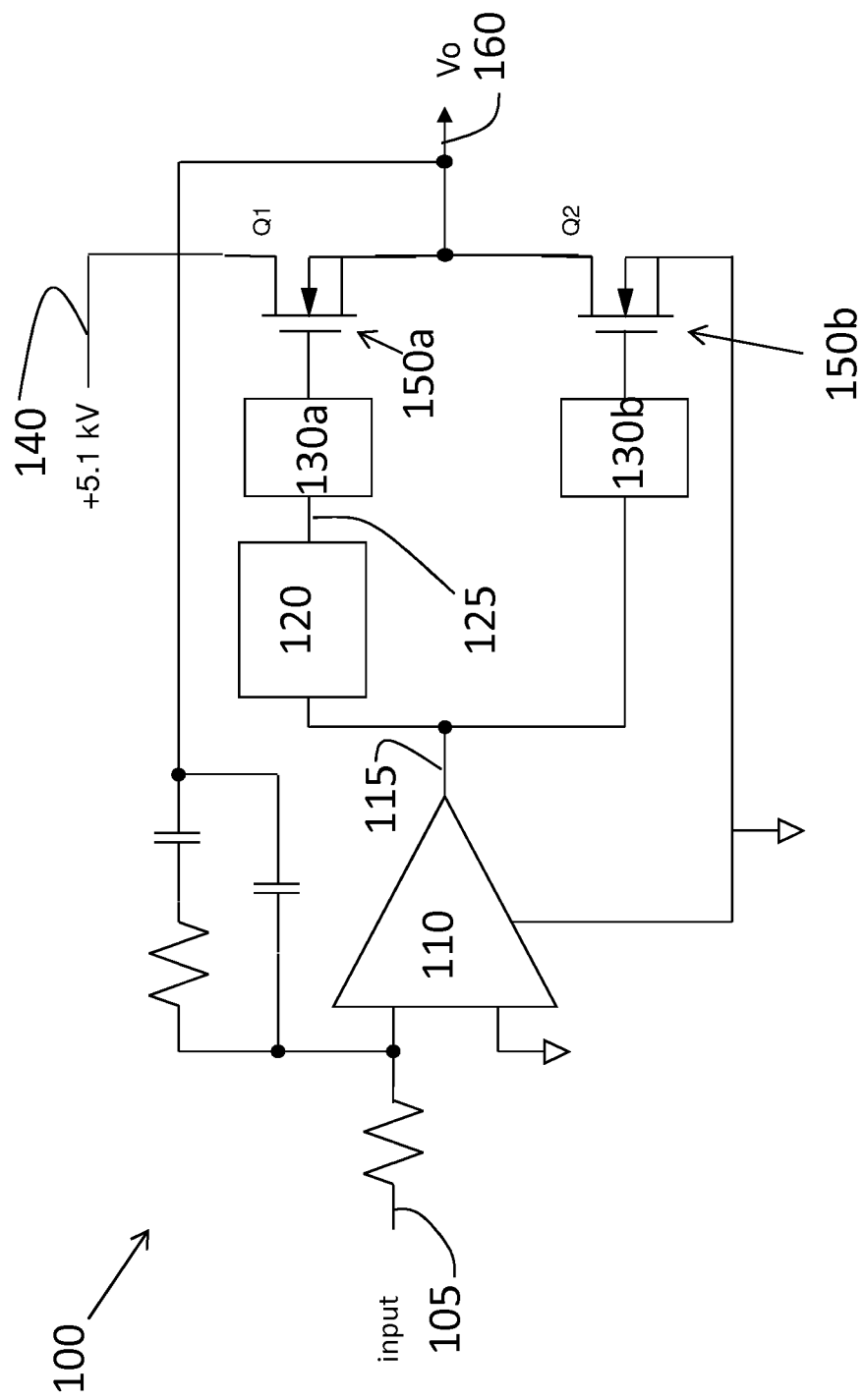
FIG. 1 is a schematic block diagram of an amplifier according to an embodiment.

FIG. 1 is a schematic block diagram of an amplifier 100 according to an embodiment. The amplifier includes an error amplifier 110 that receives an input 105. The error amplifier 110 output 115 is coupled to an upper MOSFET 150a through a linear analog optocoupler 120 whose output 125 is fed to a low impedance gate drive circuit 130a. The error amplifier 110 output 115 is directly coupled to the gate drive circuit 130b of the lower MOSFET 150b. The terms upper and lower are used to distinguish the two MOSFETs 150a, 150b but are not intended to limit the arrangement of additional embodiments of the amplifier 100. Both of the MOSFETs 150a, 150b may be, for example, 10 kV Silicon Carbide (SiC) MOSFETs that operate from approximately +5.1 kV high voltage (+HV) direct current (DC) input power 140 to provide an output capable of a range from zero volts up to a nominal +5 kV output. With a DC input power 140 (+HV) of 10 kV, the 10 kV SiC MOSFETs 150a, 150b provide an output capable of a range from zero volts up to a +10 kV output 160.

Figure 2:
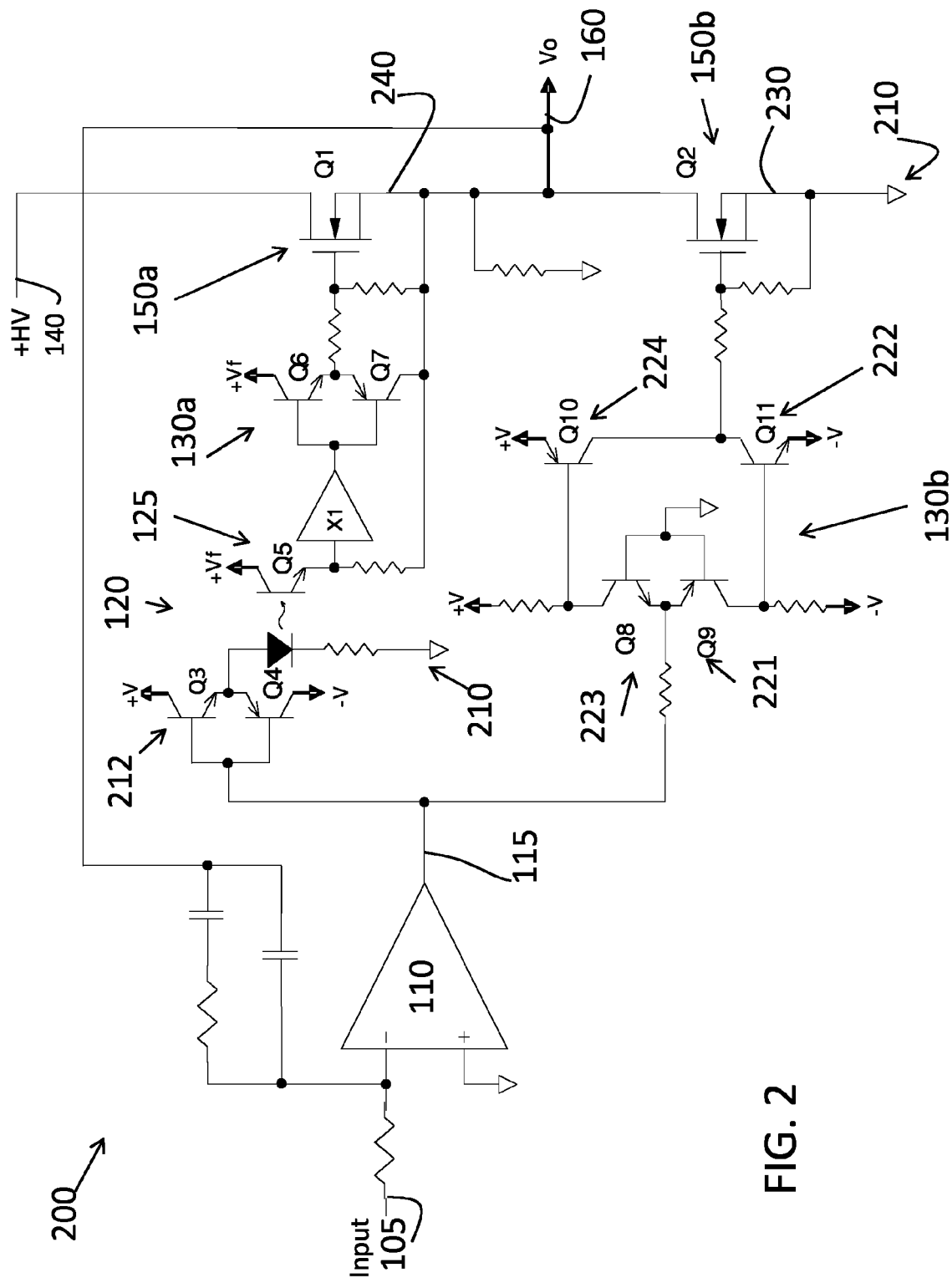
FIG. 2 is a more detailed schematic diagram illustrating a high voltage amplifier according to one embodiment of the amplifier of FIG. 1.

FIG. 2 is a more detailed schematic diagram illustrating a high voltage amplifier 200 according to one embodiment of the amplifier of FIG. 1. The exemplary gate drive circuits 130a, 130b are arranged such that the both MOSFETs 150a, 150b are not on at the same time. The error amplifier 110 output 115 must be greater than two diode drops (i.e., the voltage drop across the optocoupler 120 light emitting diode (LED) plus the voltage drop across the base-emitter junction of transistor Q3 212) before the optocoupler 120 LED is driven with current. On the other hand, the error amplifier 110 output 115 needs to be only one diode drop greater than zero to turn on transistors Q9 221 and Q11 222, which in turn shuts off the lower MOSFET 150b. Thus, the lower MOSFET 150b will be turned off before the upper MOSFET 150a is turned on. Further, an error amplifier 110 output 115 that is less than two diode drops will shut off the optocoupler 120 LED current and cause the upper MOSFET 150a to be shut off. On the other hand, an error amplifier 110 output 115 that is greater than one diode drop below ground will turn on transistors Q8 223 and Q10 224 and begin driving the lower MOSFET 150b on. That is, the upper MOSFET 150a will be off before the lower MOSFET 150b is turned on. As a result, there is no inherent cross-conduction in the output MOSFETs 150a, 150b. Because all of the amplifier 100 components, including the MOSFETS 150a, 150b, are inside the error amplifier 110 feedback loop, the error amplifier 110 will drive its output 115 as hard and as fast as necessary-within the limits of the loop compensation-to achieve the desired output voltage 160. The loop compensation can be set up to give a high value of amplification gain, (i.e., Vout (output 160)/Vin (input 105)), such as a gain of 500. While the embodiment of the amplifier 200 shown in FIG. 2 is of an inverting amplifier, alternate embodiments are not limited in this respect. For example, the amplifier 200 may be set up as a non-inverting amplifier, the feedback and biasing may be changed, and some circuit compensation may be added to prevent cross-conduction of the output MOSFETs 150a, 150b when driven at high frequencies. Other forms and/or representations may also be practiced without departing from the scope of the embodiment described herein.

The optocoupler 120 is a key enabler for operation of this high voltage amplifier 200. The optocoupler 120 may be rated for a bandwidth from DC up to a value greater than 1 MHz, such as 13 MHz, 20 MHz, or more, for example. Thus, the optocoupler 120 has the bandwidth necessary for operation of the amplifier 200. The low impedance gate drive circuits 130a, 130b, ensure that the MOSFETs 150a, 150b are driven sufficiently hard to achieve wide bandwidth response for the amplifier 200. The optocoupler 120 is necessary to drive the upper MOSFET 150a, which cannot be driven directly by a direct-coupled configuration due to a lack of suitable high voltage components such as a PNP bipolar transistor or a P channel MOSFET. The upper MOSFET 150a also cannot be driven in a capacitor-coupled configuration because the capacitor coupling configurations limit circuit bandwidth both at the lower frequency limit and at the high frequency limit. This is because, while the lower MOSFET 150b source 230 may be tied to ground 210, the upper MOSFET 150a source 240 is floating and may be driven up to the maximum output 160 voltage (e.g., 10 kV). Therefore, the circuit to couple the error amplifier 110 output 115 must be capable of driving an output referenced to high voltage with a bandwidth of DC to several megahertz. Because the optocoupler 120 has the capability of driving an output referenced to high voltage with a bandwidth of DC to several megahertz, the optocoupler 120 facilitates driving the upper MOSFET 150a, and the amplification and bandwidth desired for the amplifier 200 may be achieved with the two MOSFETs 150a, 150b.

Figure 3:
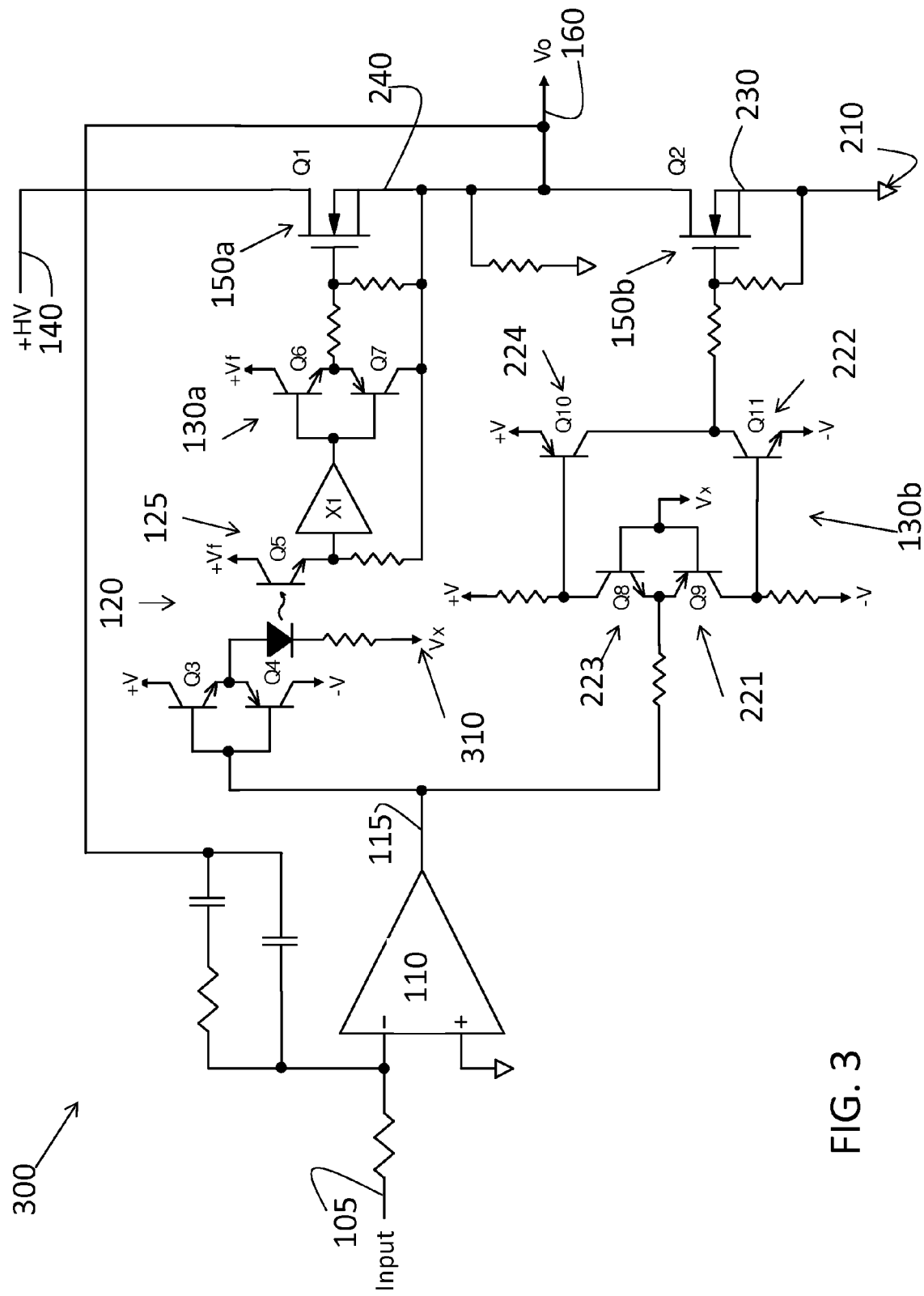
FIG. 3 is a more detailed schematic diagram illustrating a high voltage amplifier according to another embodiment of the amplifier of FIG. 1.

FIG. 3 is a more detailed schematic diagram illustrating a high voltage amplifier 300 according to another embodiment of the amplifier of FIG. 1. According to the embodiment shown in FIG. 3, the optocoupler 120 LED and the transistors Q8 223 and Q9 221 are referenced to some voltage Vx 310 that is different from zero or ground (see e.g., FIG. 2, 210). According to one embodiment, Vx 310 may be half of the bias supply voltage such that a single supply operational amplifier may be used for the error amplifier 110. The error amplifier 110 output 115 must be greater than two diode drops above Vx 310 before the optocoupler 120 LED can be driven with current. However, the error amplifier 110 output 115 needs to be only one diode drop greater than Vx 310 for Q9 221 and Q11 222 to be turned on, thereby shutting off the lower MOSFET 150b. Thus, the lower MOSFET 150b is turned off before the upper MOSFET 150a is turned on. An error amplifier 110 output 115 less than two diode drops above Vx 310 will shut off the optocoupler 120 LED current, causing the upper MOSFET 150a to be shut off. An error amplifier 110 output 115 greater than one diode drop below Vx 310 will cause transistors Q8 223 and Q10 224 to turn on and begin driving the lower MOSFET 150b. That is, the upper MOSFET 150a is turned off before the lower MOSFET 150b is turned on. Thus, as discussed with reference to the embodiment shown in FIG. 2, the upper and lower MOSFETs 150a, 150b are not inherently conducting at the same time. As discussed above for FIG. 2, the optocoupler 320 is a key enabler for operation of this high voltage amplifier 300, for the same reasons discussed for FIG. 2.

Figure 4:
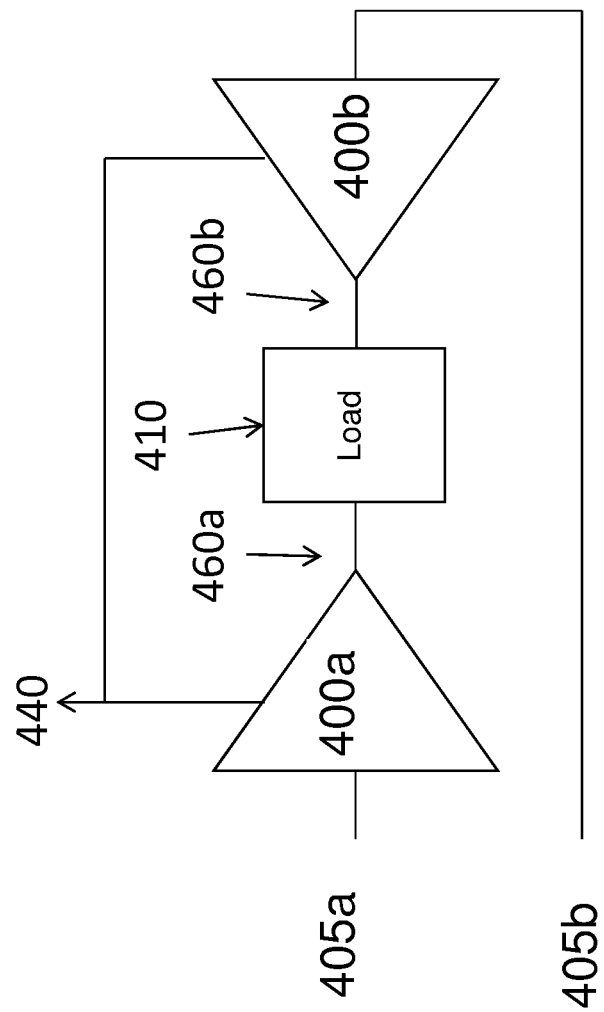
FIG. 4 is a schematic block diagram of a high voltage amplifier according to another embodiment.

FIG. 4 is a schematic block diagram of a high voltage amplifier 400 according to another embodiment. The high voltage amplifier 400 shown in FIG. 4 includes two high voltage amplifiers 400a, 400b according to embodiments described herein. The amplifiers 400a, 400b may each include two low-capacitance 10 kV SiC MOSFETs operating from a high voltage DC input power 440 to provide outputs 460a, 460b of voltages from zero volts up to +10 kV with a bandwidth of DC to several megahertz, for example. One amplifier 400a, 400b is used on each side of the load 410 to drive the load 410 in a full bridge configuration. The two amplifiers 400a, 400b provide both positive and negative voltage to the load 410 from one positive voltage source. Each amplifier 400a, 400b receives a waveform command 405a, 405b, respectively, from control electronics. Each amplifier 400a, 400b receiving a separate waveform command 405a, 405b, respectively, may maintain accuracy of the output 460a, 460b of each amplifier 400a, 400b. In alternate embodiments, the high voltage amplifier 400 may receive only one waveform command 405 and include a circuit or processor to perform command conversion math to obtain the two separate waveform commands 405a, 405b. Centering the voltage outputs 460a, 460b of the two amplifiers 400a, 400b to half of the supply voltage 440 applies equal voltage to each side of the load 410, which results in zero voltage across the load 410. Application of an input signal 405a which causes the amplifier 400a output 460a to rise to greater than half of the supply voltage 440, and application of an input signal 405b which causes the amplifier 400b output 460b to drop to less than half of the supply voltage 440 causes the application of voltage having a polarity which may be defined as positive across the load 410. Application of an input signal 405a which causes the amplifier 400a output 460a to drop to less than half of the supply voltage 440, and application of an input signal 405b which causes the amplifier 400b output 460b to rise to greater than half of the supply voltage 440 causes the application of voltage having a polarity which may be defined as negative across the load 410. Thus, the amplifier 400 provides both positive and negative voltage to the load 410 from one positive voltage source.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:
1. A high voltage amplifier, comprising:
a first metal-oxide-semiconductor field-effect transistor (MOSFET) driven by a first gate drive circuit;

a second MOSFET driven by a second gate drive circuit; and an error amplifier, the error amplifier output directly coupled to the first gate drive circuit;

a first optocoupler coupled to the second gate drive circuit, wherein the first MOSFET and the second MOSFET drive a first output voltage.

2. The high voltage amplifier according to claim 1, wherein the first MOSFET and the second MOSFET are Silicon Carbide (SiC) MOSFETs configured to provide up to 10 kilo Volts (kV) as the first output voltage.

3. The high voltage amplifier according to claim 1, wherein the error amplifier output is coupled to the first optocoupler.

4. The high voltage amplifier according to claim 3, wherein the error amplifier output causes the first optocoupler to signal the second drive circuit to drive the second MOSFET when the first MOSFET is off.

5. The high voltage amplifier according to claim 3, wherein the error amplifier output causes the first gate drive circuit to drive the first MOSFET when the second MOSFET is off.

6. The high voltage amplifier according to claim 1, wherein the first optocoupler has a bandwidth greater than 1 mega Hertz (MHz).

7. The high voltage amplifier according to claim 1, further comprising:
a third MOSFET driven by a third gate drive circuit and a fourth MOSFET driven by a fourth gate drive circuit; and
a second optocoupler coupled to the fourth gate drive circuit, wherein
the third MOSFET and the fourth MOSFET drive a second output voltage.

8. The high voltage amplifier according to claim 7, further comprising:
a load arranged to receive the first output voltage on a first side and receive the second output voltage on a second side, the first side being opposite the second side.

9. The high voltage amplifier according to claim 8, wherein the first output voltage is controlled based on a first command signal and the second output voltage is controlled based on a second command signal.

10. The high voltage amplifier according to claim 9, wherein the first output voltage and the second output voltage are controlled to provide both positive and negative output voltage polarity to the load.

11. A method of assembling a high voltage amplifier, the method comprising:
arranging a first metal-oxide-semiconductor field-effect transistor (MOSFET) to be driven by a first gate drive circuit;
arranging a second MOSFET to be driven by a second gate drive circuit;
arranging an error amplifier to output the error amplifier output directly to the first gate drive circuit; and
arranging a first optocoupler to be coupled to the second gate drive circuit, wherein
the first MOSFET and the second MOSFET drive a first output voltage.

12. The method according to claim 11, further comprising arranging the error amplifier to output the error amplifier output to the first optocoupler.

13. The method according to claim 12, further comprising the error amplifier output controlling the first optocoupler to signal the second drive circuit to drive the second MOSFET when the first MOSFET is off.

14. The method according to claim 12, further comprising the error amplifier output controlling the first gate drive circuit to drive the first MOSFET when the second MOSFET is off.

15. The method according to claim 11, further comprising:
arranging a third MOSFET to be driven by a third gate drive circuit;
arranging a fourth MOSFET to be driving by a fourth gate drive circuit; and
arranging a second optocoupler to be coupled to the fourth gate drive circuit, wherein
the third MOSFET and the fourth MOSFET drive a second output voltage.

16. The method according to claim 15, further comprising arranging a load to receive the first output voltage on a first side and receive the second output voltage on a second side, the first side being opposite the second side.

17. The method according to claim 16, further comprising controlling the first gate drive circuit and the first optocoupler based on a first command signal and controlling the third gate drive circuit and the second optocoupler based on a second command signal.

18. The method according to claim 17, wherein the controlling the first gate drive circuit and the first optocoupler and the controlling the third gate drive circuit and the second optocoupler to provide both positive and negative output voltage polarity to the load.

19. A method of operating a high voltage amplifier, the method comprising:
driving a first metal-oxide-semiconductor field-effect transistor (MOSFET) with a first gate drive circuit;
driving a second MOSFET with a second gate drive circuit;
coupling an error amplifier output directly to the first gate drive circuit;
coupling a first optocoupler coupled to the second gate drive circuit; and
driving, with the first MOSFET and the second MOSFET, a first output voltage.

20. The method according to claim 19, further comprising controlling the first optocoupler to signal the second drive circuit to drive the second MOSFET when the first MOSFET is off and controlling the first gate drive circuit to drive the first MOSFET when the second MOSFET is off.

* * * * *